United States Patent [19]
Feld et al.

[11] Patent Number: 6,160,453
[45] Date of Patent: *Dec. 12, 2000

[54] HIGH-FREQUENCY POWER AMPLIFIER

[75] Inventors: Peter Feld, Nuremberg; Horst Kroeckel, Bamberg; Markus Vester, Erlangen, all of Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 09/220,111

[22] Filed: Dec. 23, 1998

[51] Int. Cl.$^7$ ........................................................ H03F 3/04
[52] U.S. Cl. .............................. 330/289; 330/277; 330/68
[58] Field of Search .................. 330/289, 68, 65, 330/277; 257/706, 707, 712; 361/717, 718, 722, 704, 707, 723

[56] References Cited

U.S. PATENT DOCUMENTS

| | | | |
|---|---|---|---|
| 5,828,551 | 10/1998 | Hoshino et al. | 361/697 |
| 5,892,279 | 4/1999 | Nguyen | 257/712 |
| 5,925,901 | 7/1999 | Tsutsui | 257/276 |
| 5,940,271 | 8/1999 | Mertol | 361/704 |
| 5,986,885 | 11/1999 | Wyland | 361/704 |

FOREIGN PATENT DOCUMENTS 1067531  10/1959  Germany ................................ 330/289

*Primary Examiner*—Benny Lee
*Assistant Examiner*—Henry Choe
*Attorney, Agent, or Firm*—Hill & Simpson

[57] ABSTRACT

A high-frequency power amplifier has a high-frequency input, a high-frequency output and at least one power transistor connected therebetween. The power transistor has a first electrode serving as a control input, a cooling terminal connected to a second electrode and a third electrode. The third electrode is connected to a high-frequency reference potential conductor and the high-frequency reference potential conductor is connected in terms of high-frequency to the second electrode. An input signal applied to the high-frequency input is coupled out as an output signal at the high-frequency output.

13 Claims, 2 Drawing Sheets

HIGH-FREQUENCY POWER AMPLIFIER

BACKGROUND OF THE INVENTION

1. Field of the Invention

The present invention is directed to a high-frequency power amplifier with a high-frequency input, a high-frequency output and at least one power transistor connected therebetween, of the type wherein the power transistor has a first electrode serving as control input, a cooling terminal connected to a second electrode and a third electrode.

2. Description of the Prior Art

Power transistors utilized in high-frequency power amplifiers require cooling for the elimination of dissipated power which can be considerable. Cooling terminals of the power transistors are usually fashioned as cooling vanes via which the transistors are thermally conductively connected to a cooling member. In many transistor types, the cooling vanes are electrically conductively connected to an electrode of the transistor, usually with the drain electrode in the case of field effect transistors and usually with the collector in the case of bipolar transistors.

Due to the required current and voltage gain, the power transistors are often inserted in the high-frequency power amplifier circuitry in a manner so that high-frequency voltages such as, for example, at the source or emitter circuit occur at the drain electrode or at the collector.

The cooling terminals, accordingly, carry a considerable high-frequency potential. A direct electrical connection of the cooling terminals to the cooling member intensifies the problems with the electromagnetic compatibility because the relatively large surface of the cooling member can emit high-frequency energy in this case. This must be additionally taken into consideration in the high-frequency shielding measures.

One possibility of reducing the outlay for shielding is to connect the cooling vanes of the transistors to the cooling member via a low-capacitance and thermally conductive insulation. The cooling member is thus electrically insulated from, first, the supply voltage and, second, the high-frequency. A disadvantage of this approach is that the waste heat must be eliminated via the electrical insulation layer. For reasons of cooling capacity, the electrical insulation layer should be optimally thin and have as large an area as possible. This, however, has the effect of increasing the output capacitance of the circuit, which can have a disturbing influence on the high-frequency behavior of the circuit.

When a source follower circuit (corresponds to the drain circuit), or an emitter follower circuit (corresponds to the collector circuit) is employed in the power amplifier, no high-frequency voltage is present at the drain or the collector electrode, respectively. Only the supply voltage is applied thereto. The high-frequency input voltage and the bias for the control electrode are present at the gate or base electrode. If the cooling member is to have no electrical potential, the electrical insulation of the drain or the collector from the cooling member only has to be designed for the supply voltage. Since these electrodes are free of high-frequency voltages, the insulation can be dimensioned to meet the cooling demands, i.e. the capacitance, and thus the area of the insulation, can in theory be arbitrarily large. A disadvantage is that this circuit has no voltage gain.

SUMMARY OF THE INVENTION

An object of the present invention is to provide a high-frequency power amplifier with current and voltage gain wherein cooling terminals of the power transistors are free of high-frequency voltages.

This object is achieved in a high frequency power amplifier having at least one power transistor with a first electrode serving as a control input, a third electrode connected to a high-frequency reference potential conductor and a third electrode also connected (in terms of high-frequency) to the high-frequency output and to the high-frequency reference potential conductor, with an input signal applied to the high-frequency input being coupled out as an output signal at the high-frequency output. In this circuit, as in the source follower circuit (and emitter follower circuit), no high-frequency voltage is present at the drain electrode (or collector electrode); the drain electrodes (or collector electrodes) are thus "cold" in terms of high-frequency. A cooling member required for the cooling can be directly connected to the cooling terminals connected to the drain or collector, respectively. A control signal for the power transistor is coupled-in potential-free as a difference voltage between the gate electrode (base) and the source electrode (emitter). The high-frequency output signal is coupled out between the source electrode (emitter) and the high-frequency reference potential conductor. The difference voltage (control voltage) between the gate and the source is superimposed on the high-frequency output voltage of the power transistor in this case. The circuit delivers both voltage as well as current gains. It can also be utilized in push-pull stages.

Given a parallel circuit of a number of power transistors, all transistors can be conductively connected to a common cooling member. It is also advantageous that no d.c. voltages that are required for the supply of the transistors occur at signal transmission and transformation circuits. In other circuits, wherein a signal output ensues at the drain electrode, the operating d.c. voltage is superimposed on the high-frequency signal and must then be separated out by coupling capacitors.

The operating d.c. voltages thus can be selected very high in terms of magnitude since they do not load reactive elements of the circuit.

BRIEF DESCRIPTION OF THE PRESENTLY PREFERRED EMBODIMENTS

Figure 1:
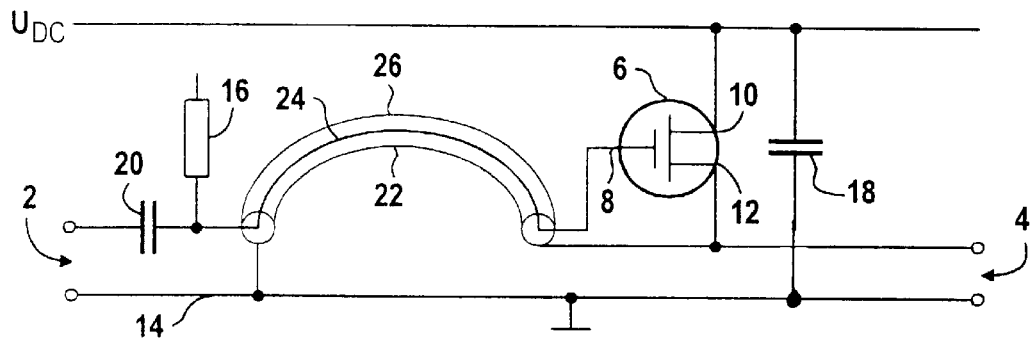
FIG. 1 is a schematic circuit diagram of a first embodiment of a high-frequency power amplifier in accordance with the invention with a simple transistor circuit having a drain electrode that is cold with respect to high-frequency and with a skin-effect current barrier.

In a schematic circuit, FIG. 1 shows a first embodiment of a high-frequency power amplifier with a simple transistor circuit. A power transistor 6 is connected between a high-frequency input 2 and a high-frequency output 4. The power transistor 6 shown in FIG. 1 also represents how a number of transistors can be connected in parallel in the circuit of FIG. 1. The power transistor 6 has a first electrode 8 as a control input, a second electrode 10 that is electrically connected to a cooling terminal (not shown) or to a cooling vane, and a third electrode 12. A field effect transistor is utilized here as the power transistor 6, the first electrode 8 thus being the gate, the second electrode 10 the drain and the third electrode 12 the source. The second electrode 10 is directly connected to a power supply (not shown) for delivering an operating d.c. voltage $U_{dc}$. A reference potential conductor 14 determines the reference potential with respect to the d.c. voltage supply and the high-frequency input and high-frequency output signals.

A drain bias required for the operation of the power transistor 6 is generated via a resistor 16. A blocking capacitor 18 connects the drain electrode 10 to the reference potential conductor 14. The high-frequency current is conducted back to ground via the blocking capacitor 18.

An input signal applied to the high-frequency input 2 is supplied via a capacitor 20 to the input of a skin-effect current barrier 22. The capacitor separates the gate bias voltage (bias at the typical level of 3 V) from the high-frequency input 2. The skin-effect current barrier 22 is constructed as a coaxial line with an inner conductor 24 and an outer conductor 26 jacketing the inner conductor 24. The inner conductor 24 connects the signal-carrying terminal of the high-frequency input 2 to the control electrode 8 of the power transistor 6. The outer conductor 26 has an input-side end facing the high-frequency input 2 connected to the reference potential conductor 14. At its output-side end facing the transistor 6, the outer conductor 26 is connected to the third electrode 12 (source electrode). The skin-effect current barrier 22 separates the third electrode 12 from the reference potential in terms of high-frequency. This is established by the coaxial conductor because a magnetic flux around the outer conductor 26 caused by the high-frequency output voltage at the high-frequency output 4 also completely surrounds the inner conductor 24. As a result, a voltage applied from the amplifier output to the outer conductor 26 is also induced at the same level in the inner conductor 24 and no difference voltage is produced in the input circuit, so that the high-frequency input 2 and the high-frequency output 4 are decoupled from one another. For increasing the necessary inductance, the coaxial conductor can also be wound as a coil.

In addition, a direct current required for the operation of the power transistor 6 is supplied to the source electrode 12 via the outer conductor 26.

Figure 2:
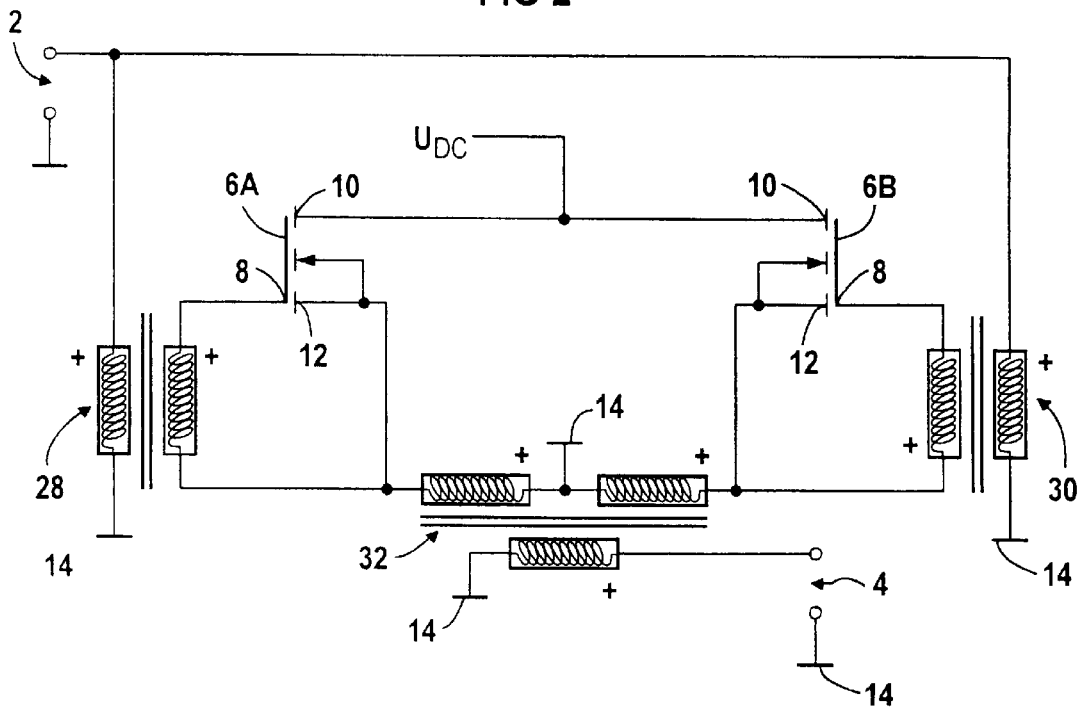
FIG. 2 shows a second embodiment of a high-frequency power amplifier in accordance with the invention with a push-pull transistor circuit having drain electrodes that are cold with respect to high-frequency and input transformers.

FIG. 2 shows a second embodiment of the high-frequency power amplifier with a push-pull transistor circuit that is connected between the high-frequency input 2 and the high-frequency output 4. The push-pull transistor circuit here is constructed with two field effect transistors 6A and 6B that also represents further transistors connected in parallel. The electrodes 8, 10, 12 of the two transistors 6A and 6B are correspondingly identified as in FIG. 1. The high-frequency control voltage supplied at the input 2 is respectively coupled in via transformers 28 and 30 between the gate 8 and the source 12 of the respective transistors 6A and 6B. Like the transistors 6A and 6B, the transformers 28 and 30 can be realized as a number of transformers connected in parallel. The input transformers 28 and 30 serve as a divider for the input power that divides the high-frequency input voltage into a positive part and a negative part respectively forward to the two transistors 6A and 6B. The supply d.c. voltage $U_{dc}$ is directly connected to the drain electrodes 10 of the two transistors 6A and 6B. Again, the supply voltage $U_{dc}$ carries no high-frequency potential. The bias for the gate electrodes 8 of the two transistors 6A, 6B is directly connected to the gate electrodes 8 via an inductor or a resistor (not shown).

The high-frequency output signal is coupled out via a further transformer 32. The transformer 32 combines the source voltages of the two transistors 6A and 6B to form the output voltage. The primary winding of the transformer 32 has a center tap that is connected to the reference potential conductor 14. The secondary winding of the transformer 32 is connected to the reference potential conductor 14 at one side; the other side of the secondary winding is connected to the signal-carrying (hot) terminal of the high-frequency output 4. Again, the voltage between the gate electrodes 8 and the source electrodes 12 is superimposed on the output voltage of the individual transistors 6A and 6B. In addition to serving for the separation of potential, the transformers 28, 30, 32 can simultaneously serve for the transformation of voltages, currents and impedances.

Figure 3:
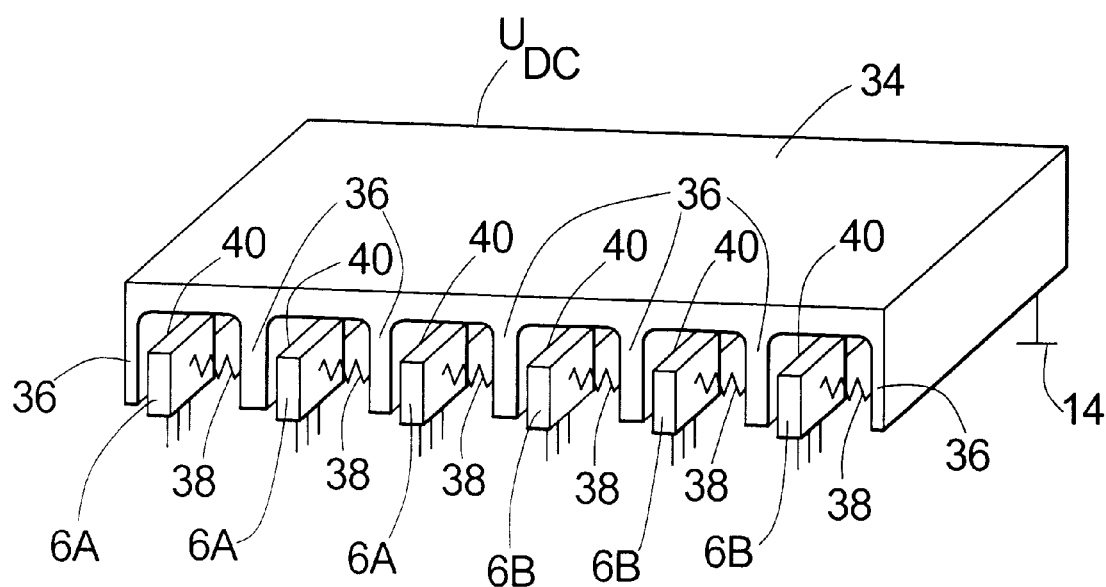
FIG. 3 is a perspective view of the mechanical structure of the power transistors of the high-frequency power amplifier on a common cooling member in accordance with the invention.

FIG. 3 shows a perspective view of a structural arrangement of the power transistors 6A and 6B of the push-pull circuit of FIG. 2 on a cooling member 34. Each push-pull branch contains three power transistors 6A or 6B connected in parallel that are electrically conductively connected on ribs 36 of the common cooling member 34 by means of springs 38, and are thermally conductively connected thereto via cooling terminals 40.

Together with the other components belonging to the circuit, the transistors 6A and 6B are soldered to a printed circuit board (not shown). The cooling member 34 covers the printed circuit board at least partially. The cooling member 34 thus performs a number of functions in the high-frequency power amplifier. First, it eliminates the dissipated power generated by the power transistors 6A and 6B. Further, the cooling member 34 represents a part of an electrical shielding since it is connected—for the high-frequency—to the high-frequency reference potential conductor 14. Finally, the delivery of the operating d.c. voltage $U_{dc}$ for the transistors 6A and 6B ensues via the cooling member 34 without significant limitations and free of high-frequency.

From the above description it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

We claim as our invention:

1. A high-frequency power amplifier comprising:
   a high-frequency input;
   a high-frequency output;
   at least one power transistor connected between said high-frequency input and high-frequency output, said power transistor having a first electrode serving as a control input, a second electrode connected to a cooling terminal and via which an operating voltage is supplied to said power transistor, and a third electrode;
   a high-frequency reference potential conductor connected in terms of high frequency to said second electrode at a node so that said second electrode is free of high frequency voltage; and
   said high-frequency output being connected across said node and said third electrode, whereby an input signal at said high-frequency input is coupled out as an output signal at said high-frequency output.

2. A high-frequency power amplifier as claimed in claim 1 further comprising a cooling member thermally conductively connected to said cooling terminal.

3. A high-frequency amplifier as claimed in claim 2 wherein said cooling terminal is electrically conductively connected to said cooling member.

4. A high-frequency amplifier as claimed in claim 2 wherein said cooling member comprises a plurality of ribs, and wherein said at least one power transistor is thermally conductively connected to one of said ribs.

5. A high-frequency power amplifier as claimed in claim 4 further comprising a spring connecting said at least one power transistor to said one of said ribs.

6. A high-frequency power transistor as claimed in claim 1 further comprising high frequency shielding connected to said cooling terminal.

7. A high-frequency power amplifier as claimed in claim 6 further comprising a cooling member thermally and electrically conductively connected to said cooling terminal, said cooling member comprising high-frequency shielding.

8. A high-frequency power amplifier as claimed in claim 1 further comprising a d.c. voltage source connected to said second electrode as said operating voltage.

9. A high-frequency power amplifier as claimed in claim 1 further comprising a cooling member thermally and electrically conductively connected to said cooling terminal, and further comprising a d.c. voltage source connected to said cooling member.

10. A high-frequency power amplifier as claimed in claim 1 further comprising a magnetically coupled transformer connected between said high-frequency input and said first electrode.

11. A high-frequency power amplifier as claimed in claim 1 further comprising a skin-effect current barrier connected between said high-frequency input and said first electrode.

12. A high-frequency power amplifier as claimed in claim 1 wherein said power transistor comprises a field effect transistor having a gate electrode comprising said first electrode, a drain electrode comprising said second electrode, and a source electrode comprising said third electrode.

13. A high-frequency power amplifier as claimed in claim 1 wherein said power transistor comprises a bipolar transistor having a base electrode comprising said first electrode, a collector electrode comprising said second electrode and an emitter electrode comprising said third electrode.

* * * * *

UNITED STATES PATENT AND TRADEMARK OFFICE
CERTIFICATE OF CORRECTION

PATENT NO.   : 6,160,453
DATED        : December 12, 2000
INVENTOR(S)  : Feld et al.

It is certified that error appears in the above-identified patent and that said Letters Patent is hereby corrected as shown below:

Title page,
Item [*] Notice, insert -- Subject to any disclaimer, the term of this patent is extended or adjusted under 35 USC 154(b) by 4 days --

Signed and Sealed this

Twenty-eighth Day of September, 2004

JON W. DUDAS
*Director of the United States Patent and Trademark Office*